(12) United States Patent
Wimmer

(10) Patent No.: US 10,873,299 B2
(45) Date of Patent: Dec. 22, 2020

(54) TRANS-IMPEDANCE AMPLIFIER TRANSFER FUNCTION COMPENSATION

(71) Applicant: Intel Corporation, Santa Clara, CA (US)

(72) Inventor: Daniel Wimmer, Munich (DE)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 16/366,108

(22) Filed: Mar. 27, 2019

(65) Prior Publication Data

US 2020/0313625 A1   Oct. 1, 2020

(51) Int. Cl.
| | | |
|---|---|---|
| *H03F 3/45* | (2006.01) | |
| *H03F 1/08* | (2006.01) | |
| *H03F 3/20* | (2006.01) | |
| *H03F 1/26* | (2006.01) | |
| *H03F 1/56* | (2006.01) | |

(52) U.S. Cl.
CPC ............... *H03F 1/083* (2013.01); *H03F 1/26* (2013.01); *H03F 1/56* (2013.01); *H03F 3/20* (2013.01)

(58) Field of Classification Search
CPC .......................................................... H03F 3/45
USPC ......................................... 330/254, 260, 261
See application file for complete search history.

(56) References Cited

U.S. PATENT DOCUMENTS

| | | | | |
|---|---|---|---|---|
| 6,909,391 | B2* | 6/2005 | Rossi | H03F 3/005 341/161 |
| 7,295,143 | B2* | 11/2007 | Ambo | H03G 1/0094 330/9 |
| 8,471,632 | B2* | 6/2013 | Onishi | H03F 1/3247 330/149 |
| 9,000,847 | B2* | 4/2015 | Zhao | H03F 3/193 330/310 |
| 9,035,700 | B2* | 5/2015 | Kitamura | H03G 9/14 330/282 |
| 9,106,208 | B2* | 8/2015 | Visconti | H03H 11/126 |
| 2006/0284603 | A1* | 12/2006 | Nehrig | G01D 5/24 320/167 |
| 2007/0030262 | A1* | 2/2007 | Ambo | H03G 1/0094 345/204 |
| 2013/0285767 | A1* | 10/2013 | Visconti | H03H 19/004 333/173 |
| 2020/0129152 | A1* | 4/2020 | Jain | A61B 8/54 |

* cited by examiner

*Primary Examiner* — Henry Choe
(74) *Attorney, Agent, or Firm* — Schiff Hardin LLP

(57) ABSTRACT

Techniques are disclosed to compensate for changes in the impedance of stage(s) preceding a trans-impedance amplifier (TIA) that is used within an RF chain. The techniques identify the changes in the source impedance value of the input stage (e.g., the mixers and LNAs) as a result of a gain state change, which alters the signal-to-transfer function (STF) of the TIA during operation and negatively impacts radio performance. The STF is maintained for changes in the source impedance value throughout different gain states without using switchable shunt components by using tunable elements to compensate for the source impedance changes, thus keeping the STF constant.

18 Claims, 4 Drawing Sheets

US 10,873,299 B2

TRANS-IMPEDANCE AMPLIFIER TRANSFER FUNCTION COMPENSATION

TECHNICAL FIELD

Aspects described herein generally relate to filters for radio frequency (RF) radios and, more particularly, to filter designs implementing adaptive tuning to maintain a constant signal transfer function (STF) over a range of changing source impedance values.

BACKGROUND

The signal transfer function (STF) of a trans-impedance amplifier (TIA) 2nd-order low-pass filter changes in a manner that is dependent upon the impedance of the preceding stage. For instance, if the gain of the preceding stage is changed via gain control, the STF changes as well. This STF change is undesirable from a system perspective.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
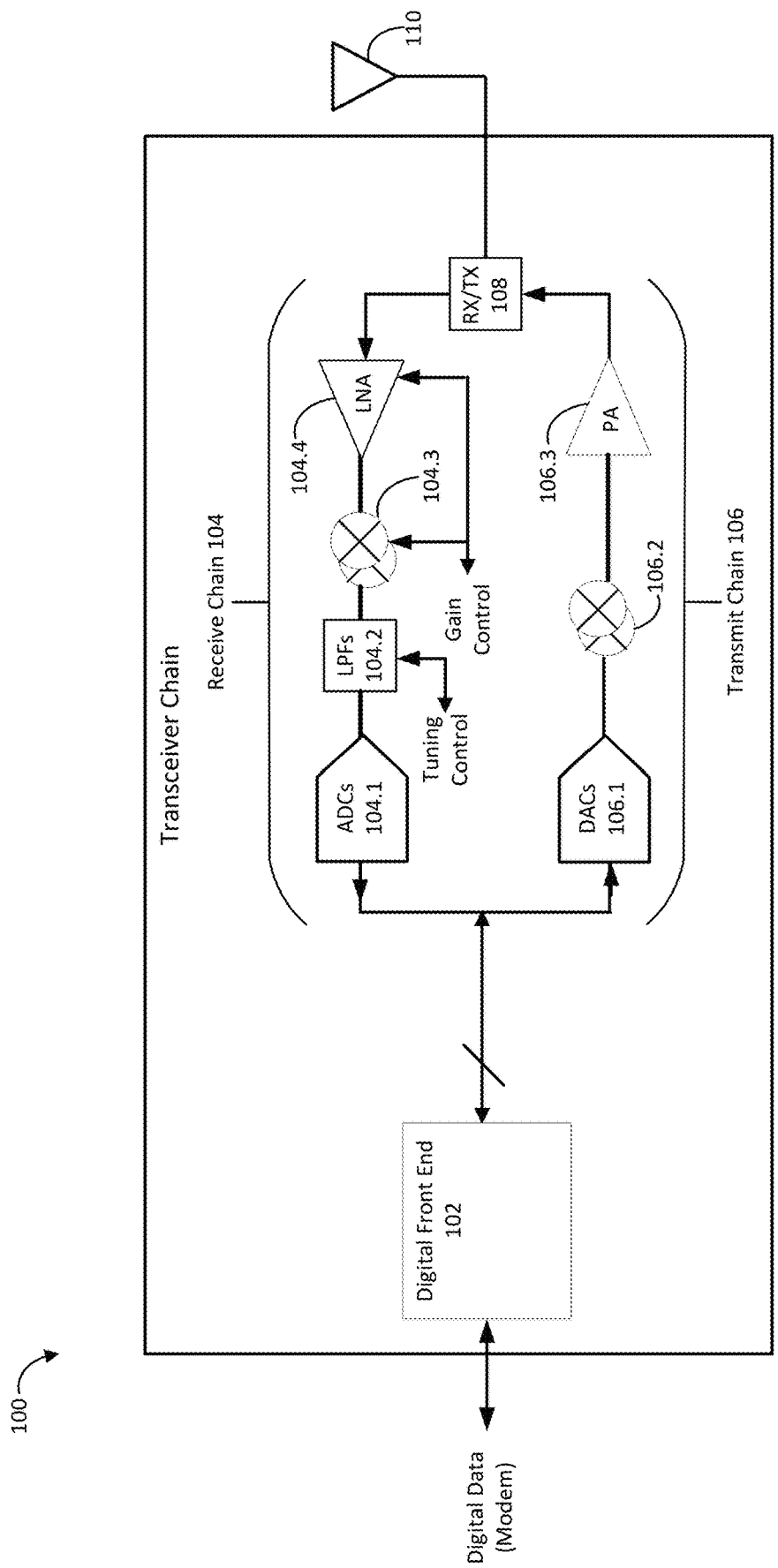
FIG. 1 illustrates a block diagram 100 of an exemplary transceiver architecture, in accordance with an aspect of the disclosure.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Modern radio designs often implement transimpedance amplifiers (TIAs) between one or more RF stages, particularly within the receive chain, to facilitate current to voltage conversion. TIAs are generally implemented with one or more operational amplifiers, and may be implemented within the receive chain between the mixer stage and the analog-to-digital (ADC) conversion stage to convert current associated with downconverted (baseband) signals to an analog voltage that may, in turn, be converted to a digital baseband data stream and processed by a digital front end.

As further discussed below, the stage(s) preceding the TIA (e.g., the mixers and LNAs) have a equivalent "source" impedance value (i.e., an output impedance in this example) that changes as a result of the gain state change, which alters the STF of the TIA during operation, negatively impacting performance. Previous attempts to compensate for this STF change include circuit designs that maintain a constant source impedance (e.g., the output impedance of the mixer/LNA stages with respect to the current example) throughout different gain states. Conventionally, this is implemented via switchable shunt components (e.g., resistors and capacitors), which are coupled via switch control when the mixers and LNAs are operating in higher gain states, and decoupled otherwise.

However, these conventional approaches lead to increased noise at the TIA output, which is the result of the resistive portion of the impedance being added via the shunt resistors. This, in turn, highly impacts the noise transfer functions (NTFs) of the TIA. In other words, by artificially lowering the source impedance via the additional of parallel shunt elements, the noise figure is negatively impacted for higher gain states.

Therefore, to remedy these issues, the present disclosure is directed to aspects in which the STF of the TIA is kept constant by tuning capacitor values within the TIA based on a known source impedance change of the preceding stages. As further discussed below, this leads to a significantly lower transceiver noise figure in higher gain states. This improves performance in the high throughput range, especially under blocker conditions.

Further with regard the term "gain state" as used herein, this is understood to be the gain of one or more preceding stages as discussed herein. The gain state (GS) may have any suitable granularity or be continuous in nature, in various aspects. In other words, the gain states may be considered gain values having an overall granularity within a range (i.e., discrete) or continuous, i.e., a specific proportion of a maximum gain state value. In any event, the gain states discussed herein may be considered as predefined or set gain states that may be controlled or adjusted. The various gain states discussed herein thus represent an overall range of gain states (e.g., in terms of a level of gain measured in dB). The notation used herein is with reference to GS0 representing the highest gain within a defined range, and another gain state GSx denoting the lowest gain within the defined range of which GS0 is the maximum gain value. As further discussed below, the value of x may vary depending upon the total gain range, i.e., the number of gain states in a discrete gain state system or the proportionality of the gain state to the maximum gain for a continuous gain state system. To provide an example, for a system with 10 discrete gain states, the notation of GS0-GS9 would represent the overall gain range, with GS0 representing the highest gain and GS9 representing the lowest gain.

FIG. 1 illustrates a block diagram 100 of an exemplary transceiver architecture, in accordance with an aspect of the disclosure. The transceiver architecture 100 as shown in FIG. 1 is for illustrative purposes and ease of explanation, and may include additional, alternate, or less components than those shown in FIG. 1. Moreover, the aspects described herein are described with respect to a receive chain architecture by way of example, although the aspects described herein are not limited to this implementation and may be utilized for any suitable filter architecture that may benefit by stabilizing a filter STF due to source impedance changes.

As shown in FIG. 1, the transceiver architecture 100 is illustrated in FIG. 1 as a single block that includes a digital front end (DFE) 102, a receive (RX) chain or path 104, a transmitter (TX) chain or path 106, a switching block 108, and an antenna 110. In various aspects, the components that form part of the transceiver chain architecture 100 may be associated with various components and may be integrated as part of the same package or occupy different packages. For example, the components that form part of the transceiver chain architecture 100 may occupy a single die, which is represented by the single block in this case. To provide another example, the components associated with the transceiver architecture 100 may be on the same die or chip, different dies or chips, or on any suitable combination of internal and external dies, chips, components, etc. Moreover, in an aspect, the transceiver architecture 100 may be associated with an individual transmit/receive chain that forms a portion of a larger overall radio design. Thus, the actual radio in which the transceiver architecture 100 is implemented may include any suitable number of transceiver chains 100, each being coupled to one or more respective antennas to be implemented, for example, in a beamforming system.

In an aspect, the DFE 102 may be communicatively coupled to a digital modem to send and receive digital data, which may be in the form of digital data streams, for example. The modem may be an external component, board, chip, etc., that is configured to process data to support wireless communications in accordance with any suitable number and/or type of wireless communication protocols. The DFE 102 may facilitate any suitable operations associated with known DFE configurations, which includes, for instance, processing baseband data for wireless data transmission and reception in conjunction with the modem and transceiver architecture 100. The DFE 102 may be configured as any suitable combination of hardware circuitry, processors, firmware, software, etc., to facilitate these functions.

In an aspect, the RX chain 104 may be coupled to the DFE 102. The RX chain 104 may be configured to couple signals wirelessly received from the antenna 110 through the RX/TX switching block 108, which may be configured to couple either the RX chain 104 or the TX chain 106 to the antenna 110 depending upon a particular mode of communication. The RX chain 104 may further couple these wirelessly received signals to a low-noise amplifier (LNA) 104.4 and to the mixer(s) 104.3. In an aspect, the mixer(s) 104.3 function to downconvert the received signals to the baseband. The downconverted signals are coupled to the ADCs 104.1 via the low-pass filter (LPF) 104.2. The ADCs 104.1 then convert the filtered baseband data signals to the DFE 102 for digital signal processing.

The aspects described herein are mainly directed to the LPF 104.2, which is further discussed below in detail with reference to FIG. 2. In an aspect, the LPF 104.2 converts a current associated with the baseband signals received from the mixer(s) 104.3 to a voltage that is fed, via the output stage (i.e., the $V_{out}$ terminals) of the LPF 104.2, to the ADCs 104.1. In an aspect, the LPF 104.2 may be implemented as a TIA amplifier that receives downconverted (e.g., baseband) signals as an input, with the LNA 104.4 and the mixer(s) 104.3 having a source impedance (with respect to the LPF 104.2) that fluctuates based upon the gain state of the LNA 104.4 and/or the mixer(s) 104.3. In other words, the "gain state" as described herein, which typically alters the STF, may be with respect to one or more of the preceding stages or combinations thereof. For instance, the gain state may be with respect to one or more LNAs, one or more mixers, or a combination of LNA(s) and mixer(s).

The gain state (e.g., gain level or amount of gain) provided by the preceding stage(s) may be controlled via one or more control lines ("gain control"), which carry gain control signals (in this example) between the LNA 104.4 and/or the mixer(s) 104.3 and a hardware processing component. This hardware processing component may include one or more processors and/or processing circuitry associated with another component of the radio in which the transceiver design 100 is implemented. For example, the processing component may be a host processor of a mobile device, a digital signal processor, an application specific integrated circuit (ASIC), etc. In response to these gain control signals, the LNA 104.4 and/or the mixer(s) 104.3 may adjust the gain level, which may be performed in accordance with known gain control techniques to compensate for a poor signal-to-noise ratio, a weak signal, or a strong interferer for example.

Again, as the gain state of the LNA 104.4 and/or the mixer(s) 104.3 is changed, the impedance associated with the input stage (i.e., the $V_{in}$ terminals) to the LPF 104.2 also changes. As further discussed below, the LPF 104.2 may include one or more electronically-tunable components, which are controlled via one or more tuning control signals carried on one or more control lines as shown in FIG. 1 ("tuning control"). Similar to the gain control lines, the tuning control lines may also be coupled to one or more processors and/or processing circuitry associated with another component of the radio in which the transceiver design 100 is implemented.

In an aspect, the TX chain 106 may be coupled to the DFE 102. The TX chain 106 may be configured to upconvert analog baseband signals via the mixers 106.2, which have been converted from digital baseband signals via the DACs 106.1. Moreover, the TX chain 106 may couple these unconverted signals to a power amplifier (PA) 106.3 to the antenna 110 via the RX/TX switching block 108 (e.g., during a transmit mode).

Again, the transceiver design 100 shown in FIG. 1 is provided as an example and for ease of explanation, and the RX path and the TX path 106 may have an alternate implementation than that shown in FIG. 1. For instance, the RX path 104 may include two stages of LNAs, including the LNA 104.4 and a second stage LNA (not shown). In this configuration, the LNA 104.4 may be considered an internal LNA (iLNA) when implemented on the same chip or die as the remainder of the RX chain components, whereas the second LNA may be located external to the transceiver chip and be referred to as an external LNA. In such a configuration, the preceding stage(s) may include one or more of the iLNA, the LNA, and/or the mixer(s) within the RX path 104. To provide another example, the TX chain 106 may include an RF-DAC in place of the DACs 106.1 and the mixers 106.2.

Regardless of the architecture of the RX and TX paths, the aspects described herein for the LPF 104.2 may be adapted to any suitable type of transceiver design. For example, although the individual connections are not shown in FIG. 1 for purposes of brevity, the transceiver design 100 may be associated with a quadrature or non-quadrature implementations. For example, the aspects described herein may also be applied to non-quadrature receivers. For instance, super-heterodyne receivers may use the techniques described herein via a single baseband/IF chain in accordance with non-quadrature downconversion.

For quadrature implementations, however, the RX chain 104 and TX chain 106 may include additional components and paths for each separate in-phase (I) and quadrature phase (Q) signal component. In other words, for a quadrature implementation, only a single RX path 104 and TX path 106 are illustrated. However, these single paths may actually form one of two separate paths, with only one being shown for purposes of brevity. To provide an illustrative example with regards to the RX chain 104, aspects include quadrature implementations using two separate ADCs 104.1 and LPFs 104.2, each being coupled to a separate respective output of the mixer(s) 104.3 that is associated with the I and Q signal components of the received signal provided via the output of the LNA 104.4.

Figure 2:
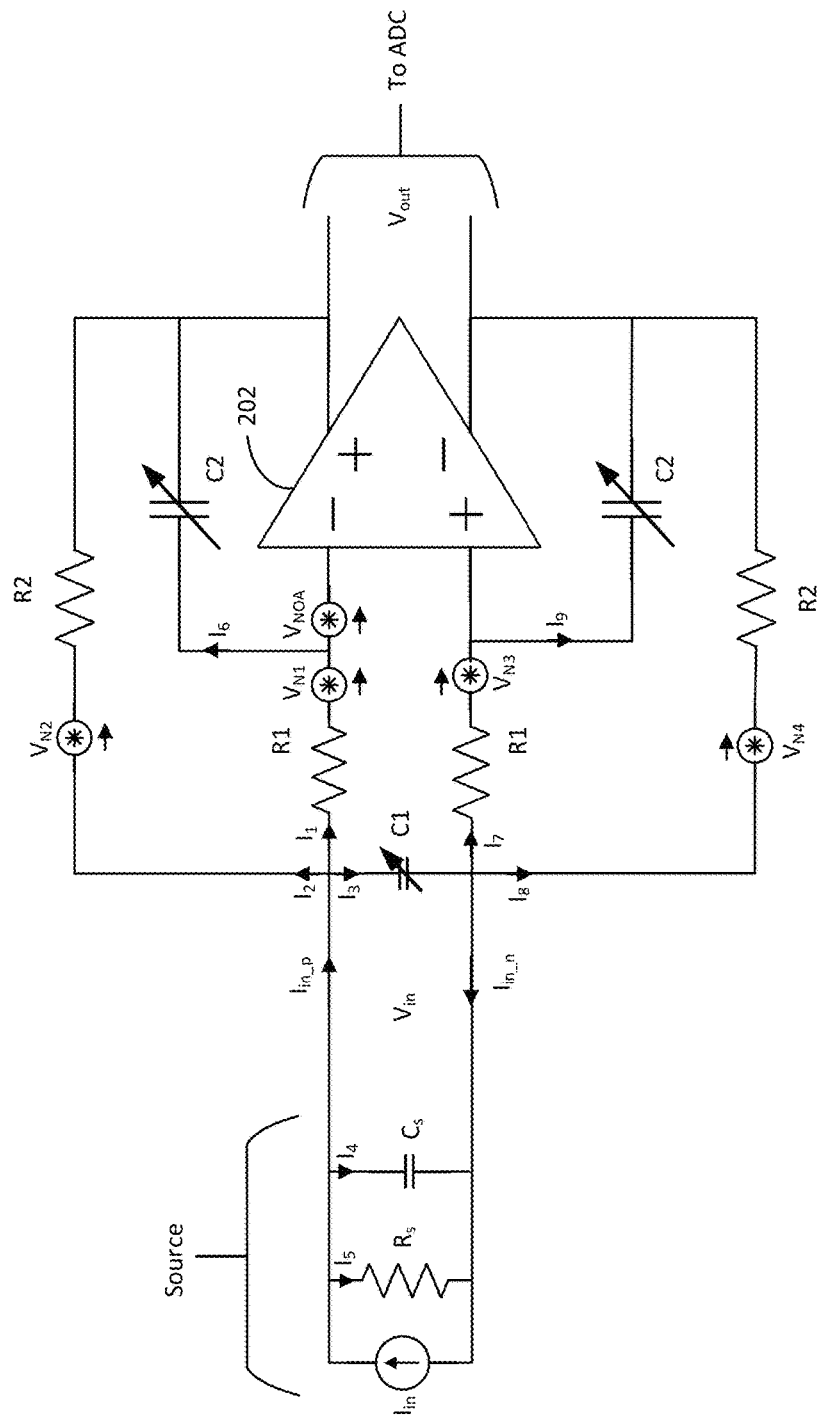
FIG. 2 is a schematic illustration of an exemplary filter, in accordance with an aspect of the disclosure.

FIG. 2 is a schematic illustration of an exemplary filter, in accordance with an aspect of the disclosure. The filter circuit 200 as shown in FIG. 2 may be identified with, for example, the LPF 104.2 as shown in FIG. 1. The filter circuit 200 includes an operational amplifier 202 and several resistors and capacitors in the configuration shown, and may represent a $2^{nd}$ order low-pass TIA. The filter circuit 200 includes an input side represented by $V_{in}$ and an output side represented with $V_{out}$. The input side is connected to a "source" that may include the input stage to the filter circuit 200. This input may represent, for instance, one or more previous stages (e.g., one or more RX chain components) and thus be identified as a source impedance from the point of view of the filter circuit 200. To provide an illustrative example, the source impedance may be identified with one or more LNA stages (e.g., an iLNA such as LNA 104.4 as well as any additional LNAs such as external LNAs, if present). The source impedance may additionally include the impedance of a mixer stage coupled to the filter circuit 200 (e.g., a downconverted I or Q signal component mixer output).

The output of the filter circuit 200 may, in turn, be coupled to an ADC (e.g., for each of the downconverted I and Q signal components, one of the ADCs 104.1 as shown in FIG. 1). Thus, the filter circuit 200 as shown in FIG. 2 includes a differential circuit topology, with a symmetric design with respect to the feedback paths and the inputs to the operational amplifier 202. With continued reference to FIG. 2, the filter circuit 200 includes two "inner" feedback paths coupled between each input of the operational amplifier 202 and the output stage, with each inner feedback path including a separate tunable capacitor C2. The filter circuit 200 also includes two "outer" feedback paths coupled between each input of the operational amplifier 202 at a node associated with each resistor R1 and the output stage, with each outer feedback path including a separate resistor R2. Moreover, the filter circuit 200 includes a tunable capacitor C1 shunted across the input terminals forming $V_{in}$.

However, although the output of the filter circuit 200 is illustrated as being differential in nature, the aspects described herein are not so limited. As an example, the filter circuit 200 may be implemented as part of single-ended design, with appropriate modifications to the circuit topology. In such a case, the equations explained herein with reference to the adaptive tuning of the C1 and C2 capacitors may be modified accordingly to achieve the desired result in light of such changes, taking into consideration modifications to the STF.

Furthermore, aspects include the filter circuit 200 being further modified from the example shown in FIG. 2 to adjust the source impedance value of the TIA with changes in the gain state. These modifications may include, for instance, adding fixed capacitor values in series with and/or in a parallel with the tunable capacitors C1 and C2. As another example, additional tunable components may be used in addition to or as a substitute to the capacitors C1 and C2, such as tunable inductors, tunable resistors, etc. The tunable range of the tunable elements may be any suitable range depending upon the amount of compensation required, the frequency of operation of the filer circuit 200, etc. This tunable range may also be adapted for different implementations of the filter circuit 200.

As shown in FIG. 2, the source impedance of the filter circuit 200 is modeled as a current source $I_{in}$ coupled in parallel with a resistor $R_S$ and a capacitor $C_S$. The filter circuit 200 also includes additional voltage noise sources $V_{N1}$, $V_{N2}$, $V_{N3}$, $V_{N4}$, and $V_{NOA}$ These voltage noise sources are not physical components of the filter circuit 200, but are instead introduced into the filter circuit 200 from various adjacent in-circuit components as a circuit representation of modeled noise for ease of explanation. In particular, the voltage noise sources $V_{N1}$, $V_{N2}$, $V_{N3}$, $V_{N4}$, and $V_{NOA}$ correspond to the noise introduced into the filter circuit 200 as a result of the adjacent resistors R1 (top), R2 (top), R1 (bottom), R2 (bottom), and the inverting input terminal of the operation amplifier 202, respectively.

In an aspect, the filter circuit 200 maintains the STF of the 2nd-order low-pass TIA constant as the source impedance changes. To illustrate the effectiveness of the design, the STF of the filter circuit 200 in the s-domain is represented below as Equation 1.

$$\frac{V_{out}}{I_{in}} = H_{STF}(s) = \frac{-2R_2}{2s^2(C_1 + C_S)C_2R_1R_2R_S + sC_2\left(R_2\left(1 + \frac{2R_1}{R_S}\right) + R_1\right) + 1} \quad \text{Eqn. 1}$$

The noise of the operational amplifier 202 is usually the highest (internal) noise contributor at the output of the filter circuit 200. Therefore, the noise transfer function (NTF) of the operational amplifier input equivalent voltage noise source ($V_{NOA}$) can be approximated for in-channel noise by the DC-component of the NTF, which is represented below as Equation 2.

$$\frac{V_{out,DC}}{V_{n,opamp,DC}} = NTF_{op,DC} = \frac{2R_2}{R_S} + 1 \quad \text{Eqn. 2}$$

Usually, the source resistance $R_S$ increases with the gain state, while the shunt capacitance $C_S$ is reduced with the gain state. Traditionally, to compensate for this behavior, an additional switchable shunt resistor is added to the input of the filter circuit 200 (i.e., the input of the TIA) in parallel with the source resistance $R_S$. In doing so, the source impedance is reduced back to its nominal value. However, because the relationship $$\left(\frac{R_2}{R_S} \gg 1\right)$$

holds true, there is a significant disadvantage in artificially reducing the source resistance $R_S$ using a shunt resistor. Specifically, the in-channel NTF of the input resistors R1 ($V_{N1}$, $V_{N3}$) is identical to that of $V_{NOA}$, and thus there is an identical effect on the noise associated with the input resistors R1 as that of the operational amplifier 202. Moreover, the in-channel NTF of the feedback resistors R2/R4 equivalent noise sources ($V_{N2}$, $V_{N4}$) cannot be influenced within this TIA topology by adding a switchable shunt resistor in parallel with the source resistance $R_S$.

Thus, aspects include the STF of the filter circuit 200 being maintained substantially constant by implementing tunable circuit components for the capacitors C1 and C2. By adjusting the capacitance values of the capacitors C1 and C2, the three summands in the denominator of the STF may be kept constant (i.e., $$2s^2(C_1 + C_S)C_2R_1R_2R_S, sC_2\left(R_2\left(1 + \frac{2R_1}{R_S}\right) + R_1\right),$$

and 1) for a range of operation during which the gain of the input stage (e.g., the LNA and/or mixer(s)) is adjusted. In other words, aspects include tuning the capacitor values instead of utilizing the traditional resistor shunt switching to modify the resistor values.

To this end, the 3rd summand is a constant value of 1 and thus maintain this as a constant is therefore trivial.

With regards to the $1^{st}$ summand $2s^2(C_1+C_S)C_2R_1R_2R_S$, this may be kept constant by adjusting the value of $C_2$ as represented below in Equation 3.

$$C_{1,GSx} = \frac{(C_{1,GS0} + C_{S,GS0})R_{S,GS0}}{C_{GSx}R_{S,GSx}} - C_{S,GSx} \qquad \text{Eqn. 3}$$

With regards to the $2^{nd}$ summand $$sC_2\left(R_2\left(1 + \frac{2R_1}{R_S}\right) + R_1\right),$$

this may be kept constant by changing the value of $C_2$ as the source resistance $R_S$ changes. This leads to the following relationship for $C_2$, as shown in below in Equation 4.

$$C_{2,GSx} = C_{GSx}C_{2,GS0} \qquad \text{Eqn. 4}$$

where $$C_{GSx} = \frac{R_1 + R_2\left(1 + \frac{2R_1}{R_{S,GS0}}\right)}{R_1 + R_2\left(1 + \frac{2R_1}{R_{S,GSx}}\right)}$$

Again, the aspects described herein may be implemented in accordance with any suitable number of discrete gain states or in a continuous manner. The index GSx represents the gain state x for Equations 3 and 4. In other words, in this example, the variable x may represent a gain of the source, or preceding, stage (e.g., the LNA 104.4 in conjunction with the mixer(s) 104.3). Continuing this example, the gain of the LNA 104.4 may therefore range between a minimum and a maximum gain state depending upon the number of gain states used. For example, if 10 gain states are used, then the minimum gain state may be denoted as GS9, and the maximum gain state may be denoted as GS0. In other words, the gain state of the LNA 104 may be expressed as GS9<GSx<GS0 as x ranges between a minimum and maximum value to control the gain of the one or more preceding stages (e.g., the LNA 104.4 and/or mixer(s) 104.3).

With this form of STF compensation, the input noise to the TIA when the input stage (e.g., the LNA) is operating in a higher gain state may be reduced. And because the TIA noise is the main contributor to noise when operating in higher gain states, this reduces the overall RX noise figure significantly. The aspects described herein thus provide additional advantages by facilitating the ability to decrease the gain with only a minor impact on the RX noise figure.

In an aspect, the gain state of the input stage to the filter circuit 200, which is represented as GSx, may be correlated to the impedance of the input stage. As an example, a correlation may be mapped between the gain state of the LNA 104.4 and/or the mixer(s) 104.3 and the resulting impedance of the LNA 104.4 in combination with the mixer(s) 104.3, which represent the input to the filter circuit 200. In accordance with these aspects, the gain control signals set the gain state of the LNA 104.4 and/or the mixer(s) 104.3, and therefore this gain state is known by the processing device that generates these gain control signals. Furthermore, the impedance of the input stage to the filter circuit 200 changes as a function of the gain state in a manner that may be known a priori. The correlation between the gain state and source impedance may be derived, for example, from test data, calibration data performed at the factory during manufacturing, etc. Aspects include this data being stored at any suitable level of granularity depending upon the desired level of control over the tuning elements within the filter capacitor circuit 200 (e.g., C1 and C2 as shown in FIG. 2). For instance, test data correlating the gain state GSx to the source impedance may be stored as a set of data points, which may include 4, 8, 16, 32, data points, a hundred data points, several hundred data points, etc. For aspects in which continuous gain states are utilizes as an alternative to discrete ones, the gain state GSx may be calculated directly from an equation that represents the gain state as a function of the source impedance, which may be evaluated to calculate a precise gain state GSx for source impedance variations.

Aspects include using these data points to determine, for a current gain state GSx, a matching source impedance value, which may be obtained via interpolation, for example. As another example, if a lesser number of data points are used (e.g., 4), different ranges of gain state levels may be associated with a source impedance value for that range. To provide an illustrative example, gain state data may be collected and stored for gain states GS0, GS1, GS2, GS3, GS4, GS5, GS6, GS7, GS8, and GS9, together with matching source impedance values for the varying $R_S$ resistance and CS capacitance within each range as represented in Table 1 below. Each of the gain states GS1-GS9 may represent, for example, a proportion of the overall maximum gain level associated with GS0.

TABLE 1

| Gain State | Source Impedance Values |
| --- | --- |
| GS0 | RS(0), CS(0) |
| GS1 | RS(1), CS(1) |
| GS2 | RS(2), CS(2) |
| GS3 | RS(3), CS(3) |
| GS4 | RS(4), CS(4) |
| GS5 | RS(5), CS(5) |
| GS6 | RS(6), CS(6) |
| GS7 | RS(7), CS(7) |
| GS8 | RS(8), CS(8) |
| GS9 | RS(9), CS(9) |

Thus, the source impedance values RS(0), CS(0) would be used for the gain state GS0<GS(1), the source impedance values RS(1), CS(1) would be used for the gain state GS(1)<GS(2), and so on. In an aspect, this data may be stored in any suitable format (e.g., a lookup table (LUT)) such that the gain states may be correlated to source impedance values. In other aspects, the gain state may alternatively mapped to a function that represents changes in the source impedance values based upon changes in the gain state. These aspects may be particularly useful, for example, when the source impedance follows a well-defined function with respect to the gain state, such that the function may be evaluated instead of relying upon individual data points.

Figure 3:
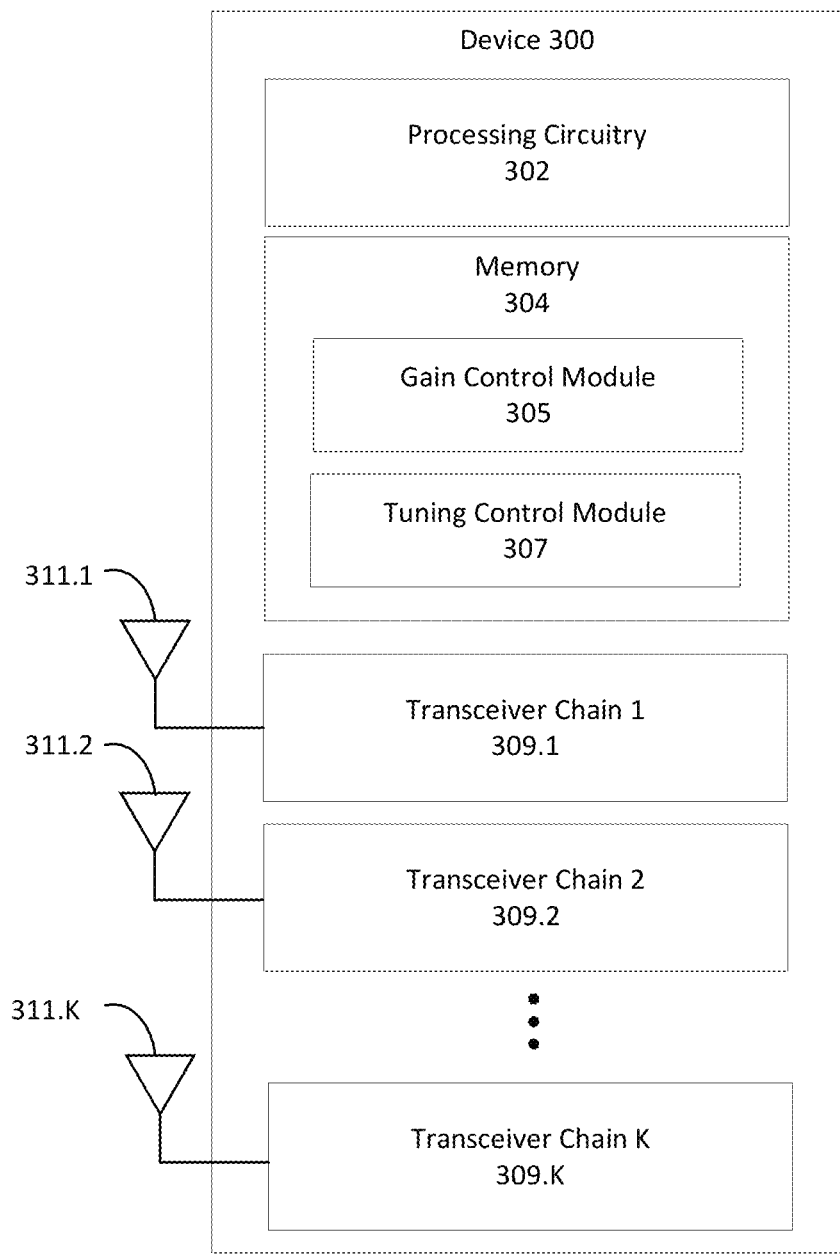
FIG. 3 illustrates a block diagram of an exemplary device, in accordance with an aspect of the disclosure.

FIG. 3 illustrates a block diagram of an exemplary device, in accordance with an aspect of the disclosure. In an aspect, the device 300 may include processing circuitry 302, a memory 304, and any suitable number K of transceiver chains 309.1-309.K, each being coupled to one or more respective antennas 311.1-311.N. The components shown in FIG. 3 are provided for ease of explanation, and aspects include device 300 including additional, less, or alternative components as those shown in FIG. 3. For example, device 300 may include one or more power sources, display interfaces, peripheral devices, ports, etc. To provide additional examples, the device 300 may further include one or more receiver chains or transmit chains in place of one or more of the transceiver chains 309.1-309.K.

In an aspect, the various components of device 300 may be identified with functionality further described herein with reference to the generation of control signals for tuning one or more components of filter circuit 200, as discussed herein. For example, the wireless device 300 may be configured to receive and/or transmit signals via one or more of transceiver chains 309.1-309.K, which are wirelessly received and/or transmitted via the coupled antennas 311.1-311.K at any suitable frequency or band of frequencies, and/or in accordance with any suitable number and type of communication protocols. Each of the transceiver chains 309.1-309.K may be identified with, for example, a transceiver chain such as the transceiver chain 100 as shown and described herein with reference to FIG. 1.

To do so, processing circuitry 302 may be configured as any suitable number and/or type of computer processors, which may facilitate control of the device 300 as discussed herein. Processing circuitry 302 may be identified with one or more processors (or suitable portions thereof) implemented by the device 300. As discussed herein, processing circuitry 302 may, for example, be identified with one or more processors implemented by the device 300 such as a host processor of the device 300, a digital signal processor, one or more microprocessors, microcontrollers, an application-specific integrated circuit (ASIC), etc. In any event, aspects include the processing circuitry 302 being configured to carry out instructions to perform arithmetical, logical, and/or input/output (I/O) operations, and/or to control the operation of one or more components of the device 300.

For example, the processing circuitry 302 can include one or more microprocessor cores, memory registers, buffers, clocks, etc., and may tune portions of the filter circuit 200 as discussed herein Moreover, aspects include processing circuitry 302 communicating with and/or controlling functions associated with the memory 304 and/or other components of the transceiver chains 309.1-309.K. This may include, for example, monitoring signals received via one or more of antennas 311.311.K, calculating a gain value and/or setting for one or more LNAs and/or mixer(s) included in the transceiver chains 309.1-309.K (e.g., LNA 104.4 and/or mixer(s) 104.3), and/or setting the gain value for these LNAs.

In an aspect, the memory 304 stores data and/or instructions such that, when the instructions are executed by the processing circuitry 302, the processing circuitry 302 performs various functions described herein. The memory 304 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 304 can be non-removable, removable, or a combination of both.

For example, the memory 304 may be implemented as a non-transitory computer readable medium storing one or more executable instructions such as, for example, logic, algorithms, code, etc. As further discussed below, the instructions, logic, code, etc., stored in the memory 304 are represented by the various modules as shown in FIG. 3, which may enable the aspects disclosed herein to be functionally realized. Alternatively, if the aspects described herein are implemented via hardware, the modules shown in FIG. 3 associated with the memory 304 may include instructions and/or code to facilitate control and/or monitor the operation of such hardware components. In other words, the modules shown in FIG. 3 are provided for ease of explanation regarding the functional association between hardware and software components. Thus, aspects include the processing circuitry 302 executing the instructions stored in these respective modules in conjunction with one or more hardware components to perform the various functions associated with the aspects as further discussed herein.

In an aspect, the executable instructions stored in gain control module 305 may facilitate, in conjunction with the processing circuitry 302, the calculation, determination, and/or control of a gain state for one or more LNAs and/or mixer(s) utilized by the filter circuit 200. Aspects include changes to the gain state being performed via the generation and transmission of control signals to the respective LNAs and/or mixer(s) (e.g., LNA 104.4 and/or mixer(s) 104.3), as discussed above with reference to FIG. 2. Additionally, the executable instructions stored in gain control module 305 may facilitate the determination of the gain state (e.g., GSx) of each LNA and/or mixer(s) associated with the input stage (i.e., the preceding stage(s)) to the filter circuit 200.

In an aspect, the executable instructions stored in the tuning control module 307 may facilitate, in conjunction with the processing circuitry 302, the calculation, determination and/or control of the capacitive tuning associated with the filter circuit 200. For example, using the gain state GSx of each LNA and/or mixer(s) input to the filter circuit 200, the source impedance value may be determined (e.g., the values of $R_S$ and CS as shown in FIG. 2 and discussed above).

This may be performed, for example, by accessing LUT data (which may be stored in the memory 304 and/or in a separate memory not shown in FIG. 3) as discussed above with reference to FIG. 2. This may also be performed for instance, by evaluating an equation that defines the source impedance as a function of the gain state, which is also discussed above with reference to FIG. 2. In any event, aspects include the executable instructions stored in the tuning control module 307 facilitating the generation and transmission of control signals to the appropriate tuning elements of the filter circuit 200 (e.g., C1 and C2) that cause the tuning elements to be adjusted to a desired value. This desired value may be determined, for example, based upon the derived source impedance value in conjunction with an evaluation of Equations 3 and 4 as discussed above to maintain the summands in the denominator of the filter circuit 200 STF constant.

Figure 4:
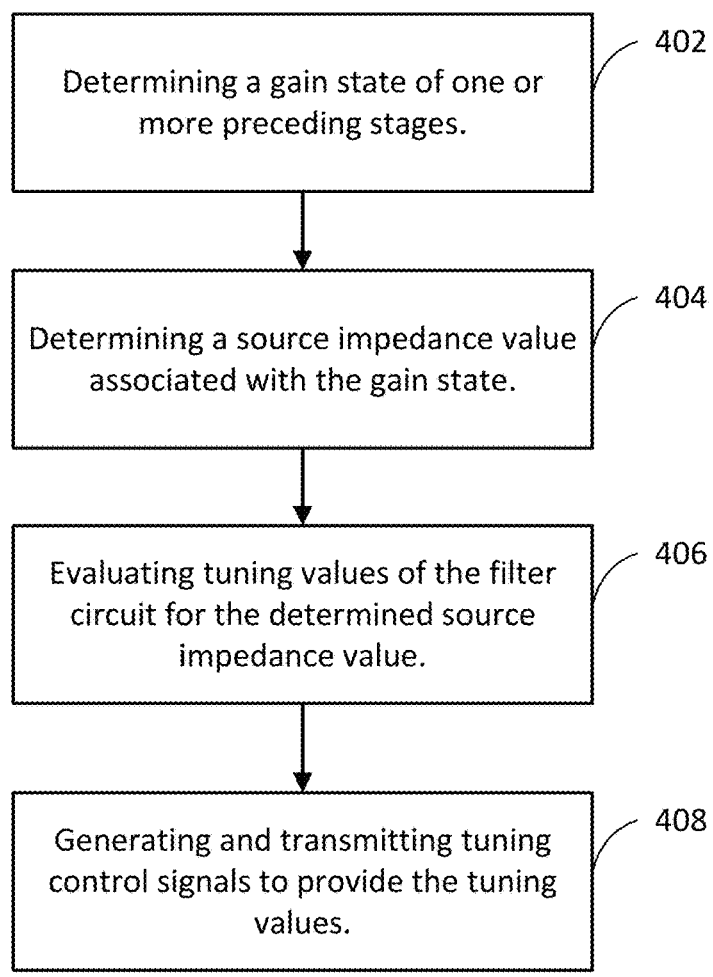
FIG. 4 is an exemplary flow, in accordance with an aspect of the disclosure.

FIG. 4 is an example flow in accordance with an aspect of the disclosure. With reference to FIG. 4, the flow 400 may be a computer-implemented method executed by and/or otherwise associated with one or more processors and/or storage devices. These processors and/or storage devices may be, for instance, associated with the device 300 as shown in FIG. 3, for example. In an aspect, flow 400 may be performed via one or more processors (e.g., processing circuitry 302 as shown in FIG. 3) executing instructions stored on a suitable storage medium (e.g., a non-transitory computer-readable storage medium such as memory 304, as shown in FIG. 3).

Flow 400 may begin when one or more processors determine (block 402) a gain state of one or more preceding stages. This may include, for example, one or more inputs or stages that feed into a portion of a receive chain, as discussed herein with reference to the transceiver chain 100. This may include, for example, identifying the gain state of one or more LNAs and/or mixer(s) that are associated with a previous stage (i.e., an input stage) to the filter circuit 200, as shown and described with reference to FIG. 2. The gain state may be determined, for example, by correlating the control signals with the gain state that is used by the processing circuitry to achieve that particular desired gain state.

Flow 400 may further include one or more processors determining (block 404) a source impedance value associated with the determined (block 402) gain state. This may be performed, for example, by accessing LUT data as discussed above with reference to FIG. 2. This may also be performed for instance, by evaluating an equation that defines changes in the source impedance as a function of changes in the gain state, as discussed above with reference to FIG. 2.

Flow 400 may further include evaluating (block 406) tuning values of the filter circuit for the determined (block 404) impedance value. These tuning values may be associated with, for example, one or more capacitors of the filter circuit 200 (e.g., capacitance values of C1 and C2) as noted above. This desired values may be determined, for example, based upon the derived source impedance value (block 404) in conjunction with evaluating Equations 3 and 4 as discussed above to maintain the denominator of the STF associated with the filter circuit 200 constant.

Flow 400 may further include generating and transmitting (block 408) tuning control signals to provide the evaluated (block 406) tuning values. This may include, for instance, generating and transmitting control signals to the appropriate tuning elements of the filter circuit 200 (e.g., C1 and C2) that cause the tuning elements of the filter circuit to be adjusted to the desired (i.e., evaluated (block 406)) values.

EXAMPLES

The following examples pertain to further aspects.

Example 1 is a filter circuit having a signal-transfer function (STF), the filter circuit comprising: an input stage coupled to a source impedance, the source impedance being associated with at least one preceding stage having an adjustable gain; an output stage; and at least one tunable component coupled between the input stage and the output stage, wherein a value of the at least one tunable component is adjustable to maintain the STF as the source impedance changes based on changes in the adjustable gain of the at least one preceding stage In Example 2, the subject matter of Example 1, wherein the filter circuit includes an operational amplifier coupled to the input stage and the output stage such that the filter circuit functions as a 2nd-order low-pass trans-impedance amplifier (TIA).

In Example 3, the subject matter of one or more of Examples 1-2, wherein the filter circuit is included within a receive chain, the filter circuit being coupled between a mixer and an analog-to-digital converter (ADC).

In Example 4, the subject matter of one or more of Examples 1-3, wherein the at least one tunable component is at least one tunable capacitor, and wherein a capacitance of the at least one tunable capacitor is adjusted to maintain the STF as the source impedance changes.

In Example 5, the subject matter of one or more of Examples 1-4, wherein: the filter circuit includes an operational amplifier coupled to the input stage to provide a differential voltage signal $V_{out}$ at the output stage, the filter circuit is symmetric with respect to the operational amplifier, the filter circuit having (i) each input of the operational amplifier coupled to a resistor $R_1$, (ii) outer feedback paths including a resistor $R_2$, (iii) inner feedback paths including a tunable capacitor $C_2$, and (iv) a tunable capacitor $C_1$ coupled across two terminals that form the input stage.

In Example 6, the subject matter of one or more of Examples 1-5, wherein: the input stage receives a current $I_{in}$, the source impedance is represented by a parallel combination of a resistance $R_S$ and a capacitance $C_S$, and the STF of the filter circuit is defined by the following equation in the s-domain:

$$\frac{V_{out}}{I_{in}} = H_{STF}(s) = \frac{-2R_2}{2s^2(C_1+C_S)C_2R_1R_2R_S + sC_2\left(R_2\left(1+\frac{2R_1}{R_S}\right)+R_1\right)+1}.$$

In Example 7, the subject matter of one or more of Examples 1-6, wherein capacitance values of the capacitors $C_1$ and $C_2$ are adjusted to compensate for changes in the source impedance based upon an evaluation of (i) $2s^2(C_1+C_S)C_2R_1R_2R_S$, and (ii)

$$sC_2\left(R_2\left(1+\frac{2R_1}{R_S}\right)+R_1\right),$$

to maintain the STF substantially constant as the gain of the at least one preceding stage is adjusted.

In Example 8, the subject matter of one or more of Examples 1-7, wherein the source impedance is determined based upon values that correlate changes of the source impedance to changes in the adjustable gain of the at least one preceding stage, and wherein the value of the at least one tunable component is adjusted based upon the determined source impedance.

Example 9 is a device, comprising: a transceiver chain including: a filter circuit having a signal-transfer function (STF), the filter circuit having (i) an input stage coupled to a source impedance, the source impedance being associated with at least one preceding stage having an adjustable gain, (ii) an output stage, and (iii) at least one tunable component coupled between the input stage and the output stage; and processing circuitry configured to adjust a value of the at least one tunable component to maintain the STF as the source impedance changes based on changes in the adjustable gain of the at least one preceding stage.

In Example 10, the subject matter of Example 9, wherein the filter circuit includes an operational amplifier coupled to the input stage and the output stage such that the filter circuit functions as a 2nd-order low-pass trans-impedance amplifier (TIA).

In Example 11, the subject matter of one or more of Examples 9-10, wherein the filter circuit is coupled between a mixer and an analog-to-digital converter (ADC).

Example 12, the subject matter of one or more of Examples 9-11, wherein the at least one tunable component is a tunable capacitor, and wherein the processing circuitry is configured to adjust a capacitance of the at least one tunable capacitor to maintain the STF as the source impedance changes.

In Example 13, the subject matter of one or more of Examples 9-12, wherein: the filter circuit includes an operational amplifier coupled to the input stage to provide a differential voltage signal $V_{out}$ at the output stage, the filter circuit is symmetric with respect to the operational amplifier, the filter circuit having (i) each input of the operational amplifier being coupled to a resistor $R_1$, (ii) outer feedback paths including a resistor $R_2$, (iii) inner feedback paths including a tunable capacitor $C_2$, and (iv) a tunable capacitor $C_1$ coupled across two terminals that form the input stage.

In Example 14, the subject matter of one or more of Examples 9-13, wherein: the input stage receives a current $I_{in}$, the source impedance is represented by a parallel combination of a resistance $R_S$ and a capacitance $C_S$, and the STF of the filter circuit is defined by the following equation in the s-domain:

$$\frac{V_{out}}{I_{in}} = H_{STF}(s) = \frac{-2R_2}{2s^2(C_1+C_S)C_2R_1R_2R_S + sC_2\left(R_2\left(1+\frac{2R_1}{R_S}\right)+R_1\right)+1}.$$

In Example 15, the subject matter of one or more of Examples 9-14, wherein the processing circuitry is configured to adjust capacitance values of the capacitors $C_1$ and $C_2$ to compensate for changes in the source impedance based upon an evaluation of (i) $2s^2(C_1+C_s)C_2R_1R_2R_S$, and (ii)

$$sC_2\left(R_2\left(1+\frac{2R_1}{R_S}\right)+R_1\right),$$

to maintain the STF substantially constant as the gain of the at least one preceding stage is adjusted.

In Example 16, the subject matter of one or more of Examples 9-15, wherein the processing circuitry is configured to calculate the source impedance by comparing a current gain of the LNA to a lookup table (LUT) of values that correlate changes of source impedance to changes in adjustable gain of the at least one preceding stage, and to adjust the value of the at least one tunable component based upon the calculated source impedance.

Example 17 is a computer-implemented method for tuning a filter circuit having a signal-transfer function (STF), the method comprising: determining, by one or more processors, a gain state of at least one preceding stage associated with a source impedance with respect to the filter circuit, the at least one preceding stage having an adjustable gain; determining, by the one or more processors, a source impedance value associated with a current gain state of the at least one preceding stage; evaluating, by the one or more processors, tuning values for the filter circuit for the determined source impedance value; and transmitting, by the one or more processors, tuning control signals to the filter circuit to cause the filter circuit to adjust a value of at least one tunable component within the filter circuit in accordance with the tuning values to maintain the STF as the source impedance changes based on changes in the adjustable gain of the at least one preceding stage.

In Example 18, the subject matter of Example 17, wherein the at least one tunable component is a tunable capacitor, and wherein the tuning control signals adjust a capacitance of the at least one tunable component to maintain the STF as the source impedance changes.

In Example 19, the subject matter of one or more of Examples 17-18, wherein the act of determining the source impedance includes comparing a current gain of the at least one preceding stage to a lookup table (LUT) of values that correlate changes of source impedance to changes in adjustable gain of the at least one preceding stage.

In Example 20, the subject matter of one or more of Examples 17-19, wherein the act of determining the source impedance includes evaluating an equation that identifies changes of the source impedance as a function of changes in the adjustable gain of the at least one preceding stage.

Example 21 is a filtering means having a signal-transfer function (STF), the filtering means comprising: an input stage means coupled to a source impedance means, the source impedance means being associated with at least one preceding stage having an adjustable gain; an output stage means; and at least one tunable means coupled between the input stage means and the output stage means, wherein a value of the at least one tunable means is adjustable to maintain the STF as the source impedance changes based on changes in the adjustable gain of the at least one preceding stage.

In Example 22, the subject matter of Example 21, wherein the filtering means includes an amplifying means coupled to the input stage means and the output stage means such that the filtering means functions as a 2nd-order low-pass trans-impedance amplifier (TIA).

In Example 23, the subject matter of one or more of Examples 21-22, wherein the filtering means is included within a receive chain, the filtering means being coupled between a mixer and an analog-to-digital converter (ADC).

In Example 24, the subject matter of one or more of Examples 21-23, wherein the at least one tunable means is at least one tunable capacitor, and wherein a capacitance of the at least one tunable capacitor is adjusted to maintain the STF as the source impedance changes.

In Example 25, the subject matter of one or more of Examples 21-24, wherein: the filtering means includes an amplifying means coupled to the input stage means to provide a differential voltage signal $V_{out}$ at the output stage means, the filtering means being symmetric with respect to the amplifying means, the filtering means having (i) each input of the amplifying means coupled to a resistor $R_1$, (ii) outer feedback paths including a resistor $R_2$, (iii) inner feedback paths including a tunable capacitor $C_2$, and (iv) a tunable capacitor $C_1$ coupled across two terminals that form the input stage means.

In Example 26, the subject matter of one or more of Examples 21-25, wherein: the input stage means receives a current $I_{in}$, the source impedance is represented by a parallel combination of a resistance $R_S$ and a capacitance $C_S$, and the STF of the filtering means is defined by the following equation in the s-domain:

$$\frac{V_{out}}{I_{in}} = H_{STF}(s) = \frac{-2R_2}{2s^2(C_1+C_S)C_2R_1R_2R_S + sC_2\left(R_2\left(1+\frac{2R_1}{R_S}\right)+R_1\right)+1}.$$

In Example 27, the subject matter of one or more of Examples 21-26, wherein capacitance values of the capacitors $C_1$ and $C_2$ are adjusted to compensate for changes in the source impedance based upon an evaluation of (i) $2s^2(C_1+C_S)C_2R_1R_2R_S$, and (ii)

$$sC_2\left(R_2\left(1+\frac{2R_1}{R_S}\right)+R_1\right),$$

to maintain the STF substantially constant as the gain of the at least one preceding stage is adjusted.

In Example 28, the subject matter of one or more of Examples 21-27, wherein the source impedance is determined based upon values that correlate changes of the source impedance to changes in the adjustable gain of the at least one preceding stage, and wherein the value of the at least one tunable means is adjusted based upon the determined source impedance.

Example 29 is a device, comprising: a transceiver means including: a filtering means having a signal-transfer function (STF), the filtering means having (i) an input stage means coupled to a source impedance, the source impedance being associated with at least one preceding stage having an adjustable gain, (ii) an output stage means, and (iii) at least one tunable means coupled between the input stage and the output stage; and processing means for adjusting a value of the at least one tunable component to maintain the STF as the source impedance changes based on changes in the adjustable gain of the at least one preceding stage.

In Example 30, the subject matter of Example 29, wherein the filtering means includes an amplifying means coupled to the input stage means and the output stage means such that the filtering means functions as a 2nd-order low-pass transimpedance amplifier (TIA).

In Example 31, the subject matter of one or more of Examples 29-30, wherein the filtering means is coupled between a mixer and an analog-to-digital converter (ADC).

Example 32, the subject matter of one or more of Examples 29-31, wherein the at least one tunable means is a tunable capacitor, and wherein the processing means adjusts a capacitance of the at least one tunable means to maintain the STF as the source impedance changes.

In Example 33, the subject matter of one or more of Examples 29-32, wherein: the filtering means includes an amplifying means coupled to the input stage means to provide a differential voltage signal $V_{out}$ at the output stage means, the filtering means being symmetric with respect to the amplifying means, the filtering means having (i) each input of the amplifying means being coupled to a resistor $R_1$, (ii) outer feedback paths including a resistor $R_2$, (iii) inner feedback paths including a tunable capacitor $C_2$, and (iv) a tunable capacitor $C_1$ coupled across two terminals that form the input stage means.

In Example 34, the subject matter of one or more of Examples 29-33, wherein: the input stage means receives a current $I_{in}$, the source impedance is represented by a parallel combination of a resistance $R_S$ and a capacitance $C_S$, and the STF of the filtering means is defined by the following equation in the s-domain:

$$\frac{V_{out}}{I_{in}} = H_{STF}(s) = \frac{-2R_2}{2s^2(C_1+C_S)C_2R_1R_2R_S + sC_2\left(R_2\left(1+\frac{2R_1}{R_S}\right)+R_1\right)+1}.$$

In Example 35, the subject matter of one or more of Examples 29-34, wherein the processing means adjusts capacitance values of the capacitors $C_1$ and $C_2$ to compensate for changes in the source impedance based upon an evaluation of (i) $2s^2(C_1+C_S)C_2R_1R_2R_S$, and (ii)

$$sC_2\left(R_2\left(1+\frac{2R_1}{R_S}\right)+R_1\right),$$

to maintain the STF substantially constant as the gain of the at least one preceding stage is adjusted.

In Example 36, the subject matter of one or more of Examples 29-35, wherein the processing means calculates the source impedance by comparing a current gain of the LNA to a lookup table (LUT) of values that correlate changes of source impedance to changes in adjustable gain of the at least one preceding stage, and adjust the value of the at least one tunable means based upon the calculated source impedance.

Example 37 is a computer-implemented method for tuning a filtering means having a signal-transfer function (STF), the method comprising: determining, by processor means, a gain state of at least one preceding stage associated with a source impedance with respect to the filtering means, the at least one preceding stage having an adjustable gain; determining, by the processor means, a source impedance value associated with a current gain state of the at least one preceding stage; evaluating, by the processor means, tuning values for the filtering means for the determined source impedance value; and transmitting, by the processor means, tuning control signals to the filtering means to cause the filtering means to adjust a value of at least one tunable means within the filtering means in accordance with the tuning values to maintain the STF as the source impedance changes based on changes in the adjustable gain of the at least one preceding stage.

In Example 38, the subject matter of Example 37, wherein the at least one tunable means is a tunable capacitor, and wherein the tuning control signals adjust a capacitance of the at least one tunable component to maintain the STF as the source impedance changes.

In Example 39, the subject matter of one or more of Examples 37-38, wherein the act of determining the source impedance includes comparing a current gain of the at least one preceding stage to a lookup table (LUT) of values that correlate changes of source impedance to changes in adjustable gain of the at least one preceding stage.

In Example 40, the subject matter of one or more of Examples 37-39, wherein the act of determining the source impedance includes evaluating an equation that identifies changes of the source impedance as a function of changes in the adjustable gain of the at least one preceding stage.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A filter circuit having a signal-transfer function (STF), the filter circuit comprising:
    an input stage coupled to a source impedance, the source impedance being associated with at least one preceding stage having an adjustable gain that, when changed, results in a change in the source impedance;
    an output stage; and
    at least one tunable component coupled between the input stage and the output stage,
    wherein a value of the at least one tunable component is adjustable to maintain the STF as the source impedance changes as a result of changes in the adjustable gain of the at least one preceding stage,
    wherein the source impedance is determined based upon values that correlate changes of the source impedance to changes in the adjustable gain of the at least one preceding stage, and
    wherein the value of the at least one tunable component is adjusted based upon the determined source impedance.

2. The filter circuit of claim 1, wherein the filter circuit includes an operational amplifier coupled to the input stage and the output stage such that the filter circuit functions as a 2nd-order low-pass trans-impedance amplifier (TIA).

3. The filter circuit of claim 1, wherein the filter circuit is included within a receive chain, the filter circuit being coupled between a mixer and an analog-to-digital converter (ADC).

4. The filter circuit of claim 1, wherein the at least one tunable component is at least one tunable capacitor, and
    wherein a capacitance of the at least one tunable capacitor is adjusted to maintain the STF as the source impedance changes.

5. The filter circuit of claim 1, wherein:
    the filter circuit includes an operational amplifier coupled to the input stage to provide a differential voltage signal $V_{out}$ at the output stage,
    the filter circuit is symmetric with respect to the operational amplifier, the filter circuit having (i) each input of the operational amplifier coupled to a resistor $R_1$, (ii) outer feedback paths including a resistor $R_2$, (iii) inner feedback paths including a tunable capacitor $C_2$, and (iv) a tunable capacitor $C_1$ coupled across two terminals that form the input stage.

6. The filter circuit of claim 5, wherein:
    the input stage receives a current $I_{in}$,
    the source impedance is represented by a parallel combination of a resistance $R_S$ and a capacitance $C_S$, and
    the STF of the filter circuit is defined by the following equation in the s-domain:

$$\frac{V_{out}}{I_{in}} = H_{STF}(s) = \frac{-2R_2}{2s^2(C_1+C_S)C_2R_1R_2R_S + sC_2\left(R_2\left(1+\frac{2R_1}{R_S}\right)+R_1\right)+1}.$$

7. The filter circuit of claim 6, wherein capacitance values of the capacitors $C_1$ and $C_2$ are adjusted to compensate for changes in the source impedance based upon an evaluation of (i) $2s^2(C_1+C_S)C_2R_1R_2R_S$, and (ii)

$$sC_2\left(R_2\left(1+\frac{2R_1}{R_S}\right)+R_1\right),$$

to maintain the STF substantially constant as the gain of the at least one preceding stage is adjusted.

8. A device, comprising:
a transceiver chain including:
a filter circuit having a signal-transfer function (STF), the filter circuit having (i) an input stage coupled to a source impedance, the source impedance being associated with at least one preceding stage having an adjustable gain that, when changed, results in a change in the source impedance, (ii) an output stage, and (iii) at least one tunable component coupled between the input stage and the output stage; and
processing circuitry configured to:
adjust a value of the at least one tunable component to maintain the STF as the source impedance changes as a result of changes in the adjustable gain of the at least one preceding stage,
calculate the source impedance based upon values that correlate changes of source impedance to changes in adjustable gain of the at least one preceding stage, and
adjust the value of the at least one tunable component based upon the calculated source impedance.

9. The device of claim 8, wherein the filter circuit includes an operational amplifier coupled to the input stage and the output stage such that the filter circuit functions as a 2nd-order low-pass trans-impedance amplifier (TIA).

10. The device of claim 8, wherein the filter circuit is coupled between a mixer and an analog-to-digital converter (ADC).

11. The device of claim 8, wherein the at least one tunable component is a tunable capacitor, and
wherein the processing circuitry is configured to adjust a capacitance of the at least one tunable capacitor to maintain the STF as the source impedance changes.

12. The device of claim 8, wherein:
the filter circuit includes an operational amplifier coupled to the input stage to provide a differential voltage signal $V_{out}$ at the output stage, and
the filter circuit is symmetric with respect to the operational amplifier, the filter circuit having (i) each input of the operational amplifier being coupled to a resistor $R_1$, (ii) outer feedback paths including a resistor $R_2$, (iii) inner feedback paths including a tunable capacitor $C_2$, and (iv) a tunable capacitor $C_1$ coupled across two terminals that form the input stage.

13. The filter circuit of claim 12, wherein:
the input stage receives a current $I_{in}$, the source impedance is represented by a parallel combination of a resistance $R_S$ and a capacitance $C_S$, and
the STF of the filter circuit is defined by the following equation in the s-domain:

$$\frac{V_{out}}{I_{in}} = H_{STF}(s) = \frac{-2R_2}{2s^2(C_1+C_S)C_2R_1R_2R_S + sC_2\left(R_2\left(1+\frac{2R_1}{R_S}\right)+R_1\right)+1}.$$

14. The device of claim 13, wherein the processing circuitry is configured to adjust capacitance values of the capacitors $C_1$ and $C_2$ to compensate for changes in the source impedance based upon an evaluation of (i) $2s^2(C_1+C_s)C_2R_1R_2R_S$, and (ii)

$$sC_2\left(R_2\left(1+\frac{2R_1}{R_S}\right)+R_1\right),$$

to maintain the STF substantially constant as the gain of the at least one preceding stage is adjusted.

15. A computer-implemented method for tuning a filter circuit having a signal-transfer function (STF), the method comprising:
determining, by one or more processors, a gain state of at least one preceding stage associated with a source impedance with respect to the filter circuit, the at least one preceding stage having an adjustable gain that, when changed, results in a change in the source impedance;
determining, by the one or more processors, a source impedance value associated with a current gain state of the at least one preceding stage;
evaluating, by the one or more processors, tuning values for the filter circuit for the determined source impedance value; and
transmitting, by the one or more processors, tuning control signals to the filter circuit to cause the filter circuit to adjust a value of at least one tunable component within the filter circuit in accordance with the tuning values to maintain the STF as the source impedance changes as a result of changes in the adjustable gain of the at least one preceding stage.

16. The computer-implemented method of claim 15, wherein the at least one tunable component is a tunable capacitor, and
wherein the tuning control signals adjust a capacitance of the at least one tunable component to maintain the STF as the source impedance changes.

17. The computer-implemented method of claim 15, wherein determining the source impedance includes comparing a current gain of the at least one preceding stage to a lookup table (LUT) of values that correlate changes of source impedance to changes in adjustable gain of the at least one preceding stage.

18. The computer-implemented method of claim 15, wherein determining the source impedance includes evaluating an equation that identifies changes of the source impedance as a function of changes in the adjustable gain of the at least one preceding stage.

\* \* \* \* \*